(12) United States Patent
Maheshwari

(10) Patent No.: US 7,355,489 B2
(45) Date of Patent: Apr. 8, 2008

(54) HIGH GAIN, HIGH FREQUENCY CMOS OSCILLATOR CIRCUIT AND METHOD

(75) Inventor: Sanjeev Kumar Maheshwari, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 68 days.

(21) Appl. No.: 11/351,987

(22) Filed: Feb. 10, 2006

(65) Prior Publication Data

US 2007/0188256 A1 Aug. 16, 2007

(51) Int. Cl.
*H03B 5/36* (2006.01)
(52) U.S. Cl. ........................ 331/109; 331/160
(58) Field of Classification Search ............... 331/109, 331/160, 116 FE
See application file for complete search history.

(56) References Cited

U.S. PATENT DOCUMENTS

| | | | |
|---|---|---|---|
| 4,280,091 A * | 7/1981 | Hiltner | 323/315 |
| 4,387,349 A | 6/1983 | Rapp | |
| 5,142,251 A | 8/1992 | Boomer | |
| 5,909,152 A | 6/1999 | Li et al. | |
| 7,038,550 B2 * | 5/2006 | Arigliano | 331/109 |

2002/0180542 A1 12/2002 Aihara

OTHER PUBLICATIONS van den Homberg, "A Universal 0.03-mm$^2$ One-Pin Crystal Oscillator in CMOS," IEEE Journal of Solid-State Circuits, vol. 34, No. 7, Jul. 1999, pp. 956-961.
Aebischer et al., "A 2.1-MHz Crystal Oscillator Time Base with a Current Consumption under 500 nA," IEEE Journal of Solid-State Circuits, vol. 32, No. 7, Jul. 1997, pp. 999-1005.
International Search Report, PCT/US2007/061857, mailed Jul. 10, 2007.

* cited by examiner

*Primary Examiner*—Joseph Chang
(74) *Attorney, Agent, or Firm*—Kevin L. Daffer; Daffer McDaniel, LLP

(57) ABSTRACT

An oscillator amplifier circuit is provided. The amplifier circuit can be used with a resonator to amplify and form a resonating oscillator. The amplifier circuit comprises an active circuit which includes an inverter and a current-controlled biasing circuit. One transistor of the inverter receives a voltage produced from the biasing circuit in order to place a gate terminal of that transistor at approximately a threshold voltage. The other transistor can be biased using a passive circuit element, such as a resistor. Therefore, both transistors are biased independent of each other within the optimal gain region. Large shunt capacitors are not required and the total current consumption is controlled through a variable resistor coupled to the source terminal of either the first transistor, second transistor, or possibly both transistors of the inverter to adjust the amplitude of the oscillating output.

18 Claims, 4 Drawing Sheets

HIGH GAIN, HIGH FREQUENCY CMOS OSCILLATOR CIRCUIT AND METHOD

BACKGROUND OF THE INVENTION

1. Field of the Invention

The present invention relates to an electronic circuit or subsystem and, more particularly, to an electronic oscillator that uses biasing voltages to maintain complementary metal oxide semiconductor (CMOS) transistors in a relatively low power consumptive state while achieving increased gain at higher frequencies of operation.

2. Description of the Related Art

The following descriptions and examples are not admitted to be prior art or conventional by virtue of their inclusion within this section.

Within nearly every electronic subsystem is some form of generator that produces cyclical waveforms. The waveform generator is oftentimes referred to as an oscillator. Depending on the application, an oscillator can be used to source regularly spaced pulses or clock signals. Oscillators are oftentimes rated depending on their stability and accuracy, frequency adjustability (i.e., tunability), gain of active circuit, start-up time, power consumption, etc.

There are numerous types of oscillators in the marketplace. A simple form of oscillator is an RC relaxation oscillator. More complex and stable oscillators involve the more popular LC oscillator. While LC oscillators are more stable than RC oscillators, a crystal oscillator is generally more stable than LC oscillators.

Many crystal oscillators use some from of piezoelectric resonator, and take advantage of the piezoelectric effect of converting mechanical vibrations into electrical impulses (and vice-versa). The piezoelectric crystal material generally resides external from the integrated circuit used to apply alternating currents or voltages to the crystal. Therefore, the circuit initiates and amplifies the piezoelectric effect produced from a resonating crystal. The frequency produced from the circuit is governed by the resonant frequency of the crystal, and the resonant frequency (with harmonics) is governed by the crystal's equivalent electrical (motional) RM, LM, CM and shunt capacitor CS parameters. It is desirable for a good resonator to have a large quality factor (which depends on the ratio of LM/RM i.e. ratio of motional inductor to motion resistance).

There are many types of piezoelectric resonators. For example, instead of implementing a quartz crystal, the resonator can be formed on the integrated circuit along with the active circuitry used to initiate and amplify the piezoelectric effect. Such resonators are oftentimes referred to as surface acoustic wave (SAW) resonators. Both crystal resonators, such as quartz, gallium arsenide, $LiNbO_3$, $LiTaO_3$, or FBAR(ZnO), and SAW resonators are generally well-known.

Active circuitry amplifies small noise, present at the start-up, to produce a well behaved fixed amplitude sine wave whose frequency (=1/period) is governed by the resonator attached to the active circuitry. The time taken in this process, initial noise to generation of fixed amplitude sine wave, is known as the start-up time. The start-up time depends on the start-up gain provided by the active circuit, along with the resonator parameter, and tuning capacitor values. High start-up gain can reduce the start-up time (too high a gain is also not desirable, as defined by the circuit/resonator parameters the required gain is bounded by min and max values). Higher start-up gain leads to large power consumption at the start-up. It is desirable, however, to reduce active power. To this end some form of amplitude regulation can be used which reduces gain to min gain after start-up. It is also desirable for an oscillator to have low phase noise (low rms jitter). To be able to operate at high frequencies it is also desirable to obtain the maximum performance out of the devices. It is thus required that devices be biased in their maximum gain region. This optimum biasing can help achieve reduced parasitic from devices, further reducing the overall power consumption.

SUMMARY OF THE INVENTION

The problems outlined above are in large part solved by an improved active circuit, or oscillator amplifier circuit. The circuit preferably comprises gain ($g_m$) elements. More preferably (but not limited to), the gain elements are implemented using complementary metal oxide semiconductor devices having both a p-channel transistor and a n-channel transistor connected in series between a power supply and an amplitude regulation control element, such as a tunable resistor that is coupled to ground. A mutually-coupled drain terminal suffices as one terminal to which the piezoelectric resonator is coupled. The other terminal of the resonator can be coupled directly or indirectly to the gate terminals of the first and second transistor pair that forms the gain element. This gain elements arrangement provide effective gain of $(g_{mn}+g_{mp})*(g_{dsn}\|g_{dsp})$, where "n" denotes the n-channel transistor, "p" denotes the p-channel transistor, and "ds" denotes the drain-to-source path gain for the n- and p-channel transistors. Though active circuit implementation with two gain ($g_m$) elements will be discussed in detail, it is possible to use only one gain element with a fixed load (e.g. a transistor and a fixed resistor providing effective gain of $g_m*R$)

In order to place the gate terminals of the first and second transistors at an optimal bias voltage, a current-controlled biasing circuit can be used. The biasing circuit, as one example, can include a current source and a diode-coupled transistor. The DC bias voltage thus generated across the diode-connected transistor can be connected to gate termination of a gain element through a high impedance path. The high impedance is added to reduce the loading effect of the bias generator on the resonator. A separate bias voltage can be generated for both the gain elements in the oscillator active circuit, providing optimum gain from each gain element. In another approach, one of the gain element can be self biased in the optimum gain region by placing, for example, a resistance between drain and gate terminal of a MOS transistor gain element.

As noted herein, the optimum gain region for a MOS device can be its operation in saturation region. The condition for a MOS device to operate in saturation region is |Vgs|>|Vt,| and |Vds|>|Vgs−Vt|, where Vgs is the gate to source voltage difference, Vds is the drain to source voltage difference, and Vt is the threshold voltage of the device. A threshold voltage is defined to be the voltage on the gate terminal relative to the source terminal needed to turn on a transistor. For example, the threshold voltage might be 400 mV whereas the gate voltage is 400 mV above the source voltage for a n-channel transistor and is 400 mV below the source voltage for a p-channel transistor. By pre-biasing the gate voltages, for example, within 50-100 mV of the transistor's threshold, the high frequency AC-coupled voltages produced by the piezoelectric resonator or SAW resonator can be amplified, but also do so in a CMOS environment— with minimal power consumption.

In addition, the biasing circuit along with the amplitude regulation (tunable) resistor can be used to provide programmable start-up gain. This can be done without increasing the active power consumption, while still providing needed high start-up gain. Since the active power consumption is controlled by the amplitude regulation loop, a higher start-up current can be used. This start-up current can be further made programmable to account for various crystal parameters.

The tunable resistor, coupled to one of the gain transistor pair, can be adjusted by a signal (either analog or digital) from an amplitude regulation control loop. That signal can vary depending upon changes to the oscillator amplitude. Thus, the tunable resistor value has a direct affect on the oscillator amplifier output. Depending on the targeted output amplitude, the control signal is tailored to vary the tunable resistance to a targeted resistance corresponding to that targeted output.

According to one embodiment, an oscillator amplifier circuit is provided having first and second transistors as gain elements, a biasing circuit, and a tunable resistor used to control the output amplitude with amplitude detection and regulation loop. According to another embodiment, an oscillator is provided having the gain elements coupled to receive DC voltage at approximately a threshold voltage value applied through a resistor to a gate terminals of the gain elements. A resonator, such as a crystal or SAW, is coupled between the drain terminal of the mutually-connected first and second transistors and a gate terminal of the first and second transistors, directly or through AC coupling capacitor. When used with AC coupled capacitor an input bias voltage can also be applied through a high impedance node. These various bias voltages (input bias voltage, and gain elements bias voltage) can be chosen to bias device tuning capacitors, and AC coupling capacitors in the optimum operation region along with gain optimization According to yet another embodiment, a method is provided for regulating a resonating output. The method includes regulating current and thus gain (gm*load) with the use of a tunable resistance.

According to yet another embodiment, a method is provided for setting the start-up gain. The method includes setting the bias voltage of gain elements through a biasing circuit. A programmable current can be used in the biasing circuit to set the different start-up gain. An AC voltage is then resonated across an input and an output of the gain elements.

BRIEF DESCRIPTION OF THE DRAWINGS

Other objects and advantages of the invention will become apparent upon reading the following detailed description and upon reference to the accompanying drawings in which.

Figure 1:
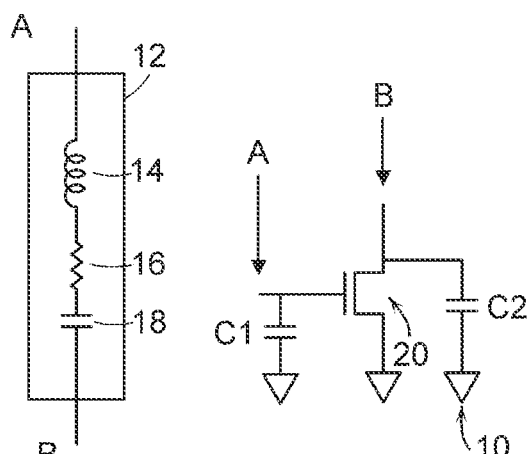
FIG. 1 circuit schematic of a two-pin oscillator used to drive a resonator placed between terminals A and B.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to the drawings, FIG. 1 illustrates one form of active circuitry 10 used to initiate and amplify output of a resonator, such as a piezoelectric resonator including, but not limited to, a crystal or SAW. A resonator 12 can be coupled across two pins labeled A and B. Resonator 12 is shown as a model of a piezoelectric resonator or SAW. Resonator 12 can be realized as an inductor 14, resistor 16, and capacitor 18.

Active circuit 10 is used to generate an active impedance $Z_A$. The active impedance $Z_A$ has both an imaginary ($Z_I$) and real resistance ($Z_R$); however, the real resistance is a negative value. For reliable start-up conditions, the value of this negative real resistance should be approximately three times larger than resonator 12 motional resistance.

Within active circuit 10 are two capacitors C1 and C2. The resonance frequency produced by circuit 10 can be trimmed by implementing capacitors C1 and C2 as capacitor banks switched by pass gates, for example. Alternatively, each capacitor can be a variable capacitor such as a varactor. In either instance, the capacitance value can be modified to produce a corresponding change in the frequency of oscillation at terminals A and B. Effectively, capacitors C1 and C2 transform the gain ($g_m$) of transistor 20 into a negative real resistance to compensate for the losses within resonator 12. Circuit 10 can be conveniently thought of as having a real impedance $Z_R$ seen by resonator 12 as being equal to $g_m/(s^2C1\times C2)$, where $s=j\omega$.

Figure 2:
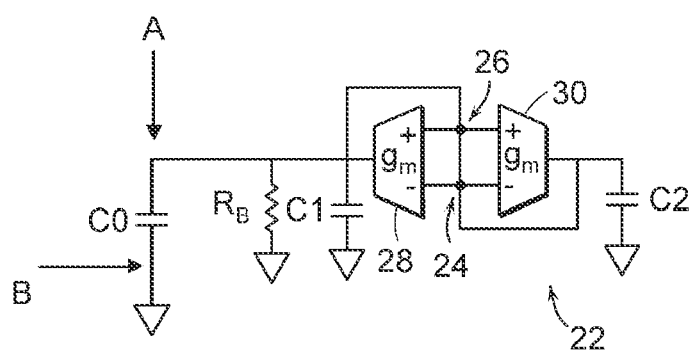
FIG. 2 is a combination circuit schematic and block diagram of a one-pin oscillator having a pair of amplifiers coupled in positive and negative feedback.

FIG. 2 illustrates an alternative active circuit embodiment 22. Instead of coupling resonator 12 across two pins as in FIG. 1, resonator 12 is coupled only to one pin A, whereas pin B can be simply coupled to ground at both resonator 12 and circuit 22. This approach is known as one-pin approach in prior arts, while the approach in FIG.1 is conveniently referred to as two-pin approach. Circuit 22, like circuit 10, contains capacitors C1 and C2 which, along with resonator define the frequency of oscillation. Negative feedback is derived from node 24, whereas positive feedback is derived from node 26. Circuit 22 is direct current (DC) stable when the negative feedback dominates the positive feedback. This is realized by using a bias resistor $R_B$ which loads the positive feedback branch to give less DC gain than the negative feedback branch provided the output impedance of amplifier 28 is sufficiently high. At the resonance frequency, the positive feedback dominates over the negative feedback, and oscillations will occur. The amount of capacitor C1 and C2 will establish the frequency response of the amplifiers 28 and 30.

One problem with circuit 22 is that it is fairly complex and has numerous components which form amplifiers 28 and 30. Each amplifier has a differential output with feedback, and the feedback must be controlled to maintain a net sum positive feedback for proper oscillation and gain. One problem with circuit 10 is that when transistor 20 is placed in saturation, a significant amount of current will be drawn from the power supply to ground to produce required gain. Moreover, impedance $Z_A$ and especially the real impedance $Z_R$ are dependent on having a large $g_m$ of transistor 20, yet with minimum added parasitic capacitance. This generally is difficult to achieve since large $g_m$ requires large transistor size, and larger transistors have larger parasitic capacitive values. Increased parasitics makes it more difficult to achieve the required gain, and also reduces the tuning range.

Circuit 32 is one of the possible implementation of the two-pin oscillator circuit introduced in the circuit10 with addition of a current source $I_0$ and a bias resistor $R_B$. The bias resistor $R_B$ is coupled across the drain and gate of transistor 34, and current from current source $I_0$ is sent through transistor 34 when $V_{GS}$ (voltage of the gate relative to source) is greater than a threshold voltage of transistor 34.

Transistor 34 is an n-channel transistor used as the amplifier or gain element. Circuit 32 is not only a simpler architecture than circuit 22 (FIG. 2), but also offers good phase noise performance. At DC, the gate and drain terminals of transistor 34 are at the same voltage value, and no current is sent through $R_B$. $R_B$ is used to place transistor 34 in the operating region that provides maximum gain. Once resonator 12 is resonating between terminals A and B, transistor 34 will eventually toggle between being fully on and fully off, unless current IO is adjusted to achieve a predefined amplitude through the use of an amplitude regulation loop.

One difficulty associated with circuit 32 is that the parasitic capacitor values, are somewhat large given the need for a fairly large n-channel transistor to achieve larger gain for high frequency operation. The increasing parasitic capacitor with size puts a limit of achievable gain while still keeping the power consumption low. Thus, circuit 32 cannot readily achieve substantial gain at frequency ranges above 300-600 MHz. Therefore, the gain is limited by the maximum current through transistor 34, and increased parasitic capacitors makes the frequency adjustability difficult when attempts are made to tune capacitors C1 and C2.

Figure 3:
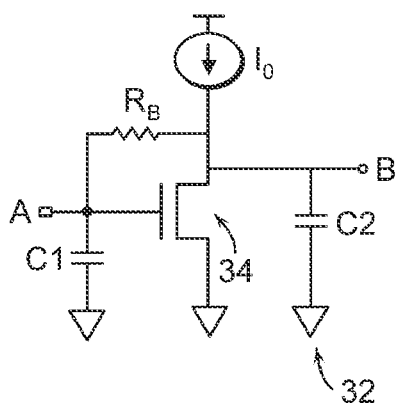
FIG. 3 is a circuit schematic of an oscillator implemented in NMOS technology with current source gain control.
Figure 4:
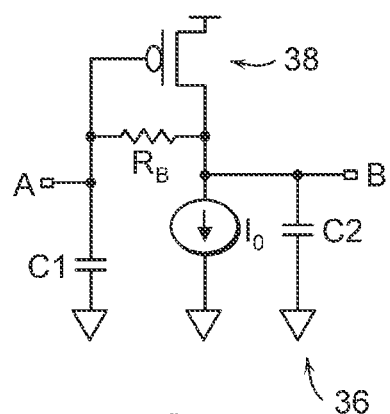
FIG. 4 is a circuit schematic of an oscillator implemented in PMOS technology with current source gain control.

Circuit 36 of FIG. 4 is another implementation of the two-pin oscillator approach in FIG. 1, in which p-channel transistor 38 is used instead of n-channel transistor 34 (FIG. 3). Therefore, circuit 36 enjoys an improvement over circuit 22 (FIG. 2); however, circuit 36 has the same shortcomings as described for circuit 32 (FIG. 3). A further disadvantage is the need to increase the size of p-channel transistor 38 in order to generate a comparable gain if, instead, a n-channel transistor were used. A larger p-channel transistor further increases the parasitic capacitors and reduces or counteracts any increase in gain at higher frequencies. Thus, it is preferable that a n-channel transistor be used to supply the gain; however, whether a n-channel or p-channel transistor is used, gain is still limited at higher frequencies using the architectures of FIGS. 3 and 4.

Figure 5:
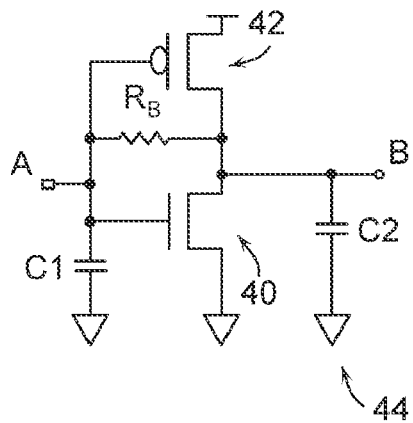
FIG. 5 is a circuit schematic of an oscillator implemented in CMOS technology.

Turning now to FIG. 5, instead of having a single transistor amplifier, amplification can be achieved using both an NMOS and a PMOS transistor. This can be essentially viewed as an inverter made up of two transistors 40 and 42 within circuit 44, biased in the maximum gain region through a bias resistance $R_B$. Again, however, it is difficult to achieve high gain at higher frequencies due to the parasitic capacitors involved with transistors 40 and 42. Those capacitance values are compounded by the load capacitors C1 and C2. The combination of parasitic capacitors and load capacitors reduces the frequency response for a given gain target or vice versa. Depending on how transistors 40 and 42 are formed and the temperature to which it is exposed, the current can vary, and gain varies correspondingly. These variations in some cases can lead to a non-functional oscillator circuit. This is a sever problem in the processes with more than +/−200 mV threshold voltage (Vt) variations, with nominal threshold voltage of 600 mV. This makes a reliable, low power oscillator design with nominal 1.8V supply extremely difficult.

Figure 6:
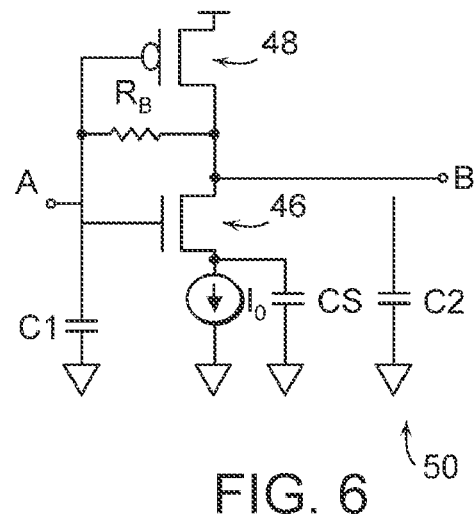
FIG. 6 is a circuit schematic of another oscillator implemented in CMOS technology.

One way in which to obtain predictable gain is to implement a current source $I_0$ along with an inverter made up of transistors 46 and 48, as illustrated by circuit 50 of FIG. 6. Current source $I_0$ alleviates the large current variation problems associated with not having a fixed current going through the inverter, as in circuit 44 (FIG. 5). However, at low power supply voltages, there is insufficient headroom due to the introduction of a current source in series with transistors 46 and 48. To exploit the gain provided by transistor 46, a large shunt capacitance CS is needed. If large gains are needed from n-channel device 46, it would be preferable that device 46 source be coupled directly to ground. However, with the introduction of current source 10, it is desirable that a shunt capacitor is used. The shunt capacitor operates as a short circuit at high frequencies, thus, effectively coupling the source of transistor 46 to ground which yields a high gain at high frequencies. However, at DC values, CS operates to store the DC voltage upon the source of transistor 46, thereby decreasing gain at lower frequencies or at DC. If circuit 50 is desired for high frequency applications, however, CS achieves its purpose of increasing the gain at those frequencies.

Figure 7:
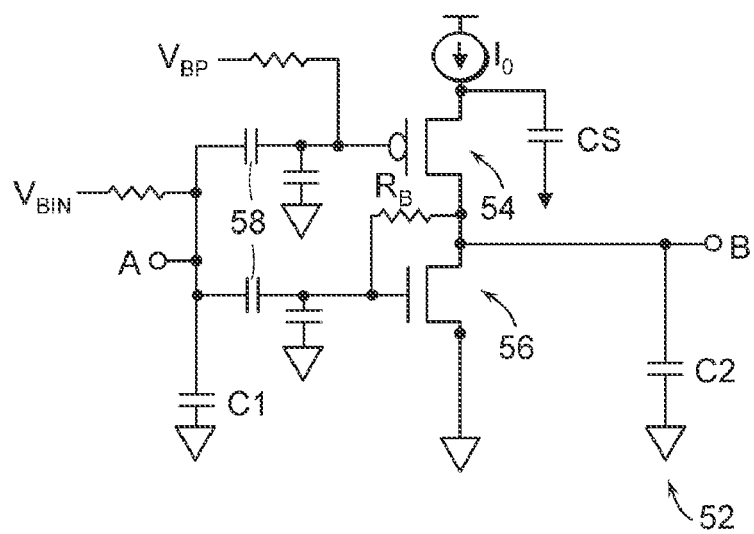
FIG. 7 is a circuit schematic of another oscillator implemented in CMOS technology and having a bias voltage applied to the NMOS and PMOS transistors to optimize gain at higher frequencies.

Circuits 44 and 50, however, have the same problem in somewhat different ways as circuits 32 (FIG. 3) and 36 (FIG. 4). Specifically, the gain is limited at high frequencies due to the parasitic capacitances and load capacitance values. Even with the introduction of a current source, a shunt capacitor is needed to fully exploit the gain achievable by gain elements. Moreover, the bias resistor $R_B$ is not always effective in maintaining the gain elements' biasing in the optimal gain region unless, of course, each input is placed at or near the maximum gain region e.g. threshold of that transistor. FIGS. 5 and 6 uses a biasing resistor that may put one transistor in the optimal gain region, but not the other, thus other transistor may have sub-optimal or no gain but still adding to the total parasitic capacitors. FIG. 7 takes one step in alleviating that problem.

Referring to FIG. 7, circuit 52 comprises transistors 54 and 56. A current source $I_O$ can be connected either to the p-channel transistor source or to the n-channel transistor source; however, as shown, the current source is connected to p-channel transistor 54. A shunt capacitor CS is used to enhance the gain of p-channel transistor 54. Similar to the arrangement of circuits 44 and 50, circuit 52 includes loading capacitors C1 and C2 which can be varied in value to modify the frequency response output across terminals A and B. Capacitor pair 58 couples input ac signal to the gain elements inputs i.e. to the gates of gain transistors. A biasing resistor $R_B$ is coupled to bias n-channel transistor 56 so that its $V_{GS}$ is approximately near $V_{TH}$ of that n-channel transistor. The biasing amount is set by current drawn from the current source to establish a voltage drop from the drain terminal to the gate terminal. A biasing voltage $V_{BP}$ is used to insert a voltage on the p-channel transistor 54 near its maximum gain region.

In this fashion, both p-channel transistor 54 and n-channel transistor 56 are biased separately from each other—dissimilar from circuits 44 and 50. By biasing the transistors separately, any process fluctuations can be accounted for between p-channel fabrication and n-channel fabrication. For example in FIG. 5 or 6, if the threshold voltage $V_{TH}$ of n-channel transistor 56 is relatively high one would typically want the bias voltage at terminal A to be as high as possible in order to maximize gain of n-channel transistor. An increase in voltage at terminal A will only help n-transistor to achieve gain, but will reduce the amount of gain in p-transistor. To resolve this conflict and to maximize gain of both the n-channel and p-channel transistors, a separate bias $V_{BP}$ can be used on p-channel transistor 54 as in FIG. 7.

As an alternative, the bias could be placed into n-channel transistor gate 56 instead of p-channel transistor gate 54, and the biasing resistor $R_B$ can be placed across the p-channel transistor. Regardless, FIG. 7 illustrates the benefits of independently biasing the gate voltages of the n-channel and p-channel transistors within an oscillator circuit. It would also be beneficial not to require a shunt capacitor on either the p-channel or n-channel transistor. Circuit 60 of FIG. 8 represents an improvement over that circuit 52 of FIG. 7.

Figure 8:
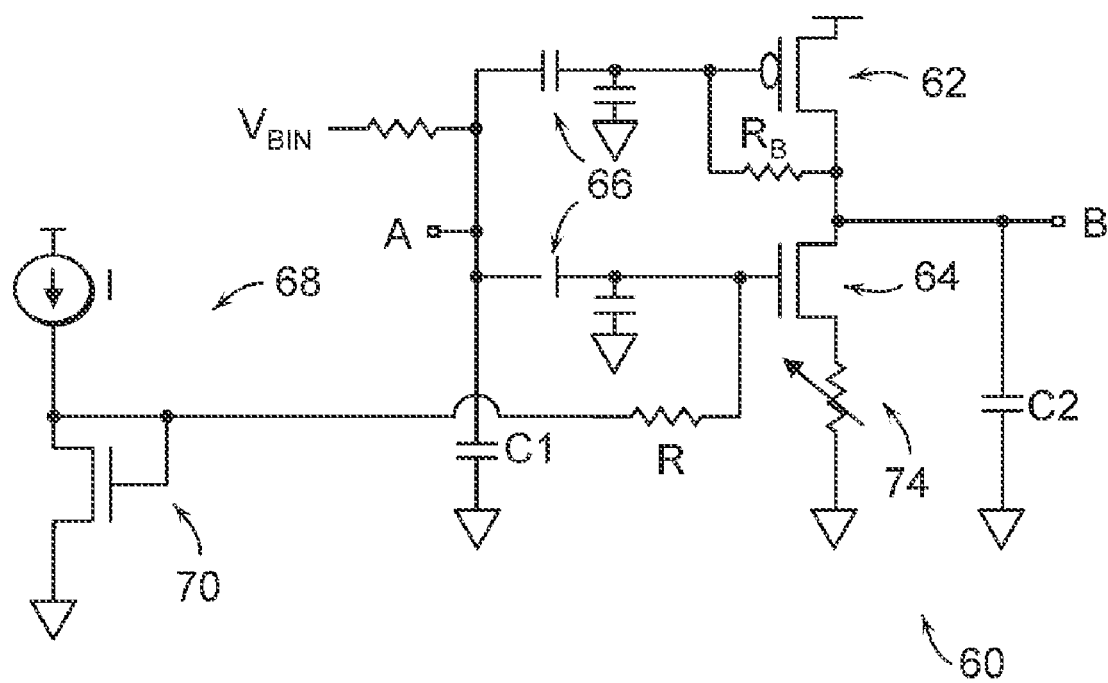
FIG. 8 is a circuit schematic of another oscillator implemented in CMOS technology and having a bias voltage applied to the NMOS and PMOS transistors to optimize gain at higher frequencies yet with gain or amplitude control.

Referring to FIG. 8, circuit 60 have a p-channel transistor 62 and a n-channel transistor 64. A biasing resistor is shown coupled to p-channel transistor 62, but could equally be coupled across n-channel transistor 64 if the circuit were flipped or inverted. Similar to FIG. 7, coupling capacitors 66 and loading capacitors C1 and C2 are provided. In FIG. 7, n-channel transistor 64 is biased through a current-controlled biasing circuit 68. Biasing circuit 68 includes a current source I coupled in series between a power supply and grounded transistor 70. Transistor 70 is diode-connected in that the gate and drain terminals are coupled together to form a diode. Current I provides the start-up current and thus sets the start-up gain through transistors 62 and 64. This current I can further be programmable to obtain the desired start-up gain along with tunable (programmable) C1 and C2 capacitors. During the start-up tunable resistance 74 has the lowest resistance value to allow the maximum gain through transistors 62 and 64 for a given start-up current I.

Bias voltage generated at transistor 70 is applied to NMOS gain element 64 through a large resistance R. Resistance values are chosen large enough such that the bias circuit does not load the oscillations at the gate of transistor 64. A bias resistor $R_B$ is coupled across the gate and drain terminals of transistor 62 to bias transistor 62 in the maximum gain region. Input bias voltage $V_{BIN}$ can be set to an optimal value which maximizes both the achievable oscillation amplitude, and flat region of synthesizable capacitor values while not overstressing any of the devices. $V_{BIN}$ biases capacitor C1 to a DC value, whereas the voltage produced by biasing circuit 70 sets the bias for transistor 64. Since the resonator output at terminal A does not have a DC value, $V_{BIN}$ is needed to set the DC values on capacitor C1.

Circuit 60 enjoys the benefits of biasing each transistor at their optimal gain region so as to provide maximum possible gain at high frequencies. The total current consumption is controlled through n-channel transistor source terminal degeneration, and the amplitude of oscillation can also be controlled by the gain control of n-channel transistor 64 through source degeneration. Start-up gain control setting can be used for optimum biasing according to desired frequency and load capacitances settings. Circuit 60 provides good phase noise performance with maximum gain, minimum device size, and low parasitic capacitances.

A variable resistor 74 is used to set the amplitude. As the resistance value within resistor 74 increases, the $V_{GS}$ value will decrease for a fixed voltage at the gate terminal produced from circuit 70. Thus, as $V_{GS}$ decreases, it reduces gain and thus the amplitude produced across terminals A and B will decrease. Therefore, there is an inverse relationship between the resistive value 74 and the gain produced from circuit 60. Therefore, instead of having a current source which regulates gain, variable resistor 74 can regulate gain.

Figure 9:
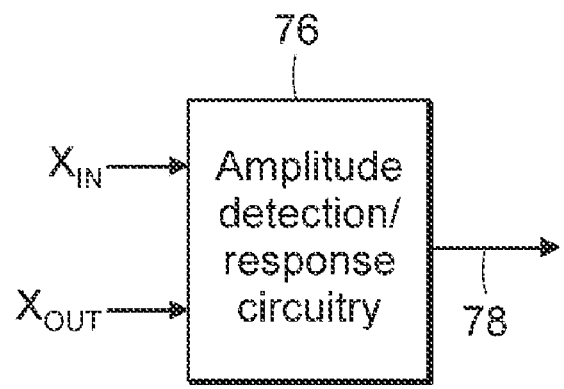
FIG. 9 is a block diagram for receiving a resonator and producing an amplitude control signal corresponding to an amplitude produced at different resonator frequencies, wherein the amplitude control signal can be used to control a variable resistor of FIG. 8.

The gain can be modeled by implementing a built in self test (BIST) block 76 on the monolithic substrate, illustrated in FIG. 9. Block 76 can receive the resonator values $X_{IN}$ and $X_{OUT}$ that would normally be placed at terminals A and B of the circuit. Upon receiving those values, an amplitude value produced from block 76 which is modeled after circuit 60 can be produced. The amplitude value at terminal 78 can then be fed to the input of variable resistor 74. In this fashion, a targeted amplitude can be established by using control voltage 78 as an input to variable resistor 74, to adjust the resistive values and the voltage swing from circuit 60 across terminals A and B. By modeling the gain through BIST 76, the gain can be readily adjusted to achieve a targeted outcome.

That target may be one that achieves the desired gain but no more and, therefore, eliminates any unnecessary power consumption. It is desirable that in order to achieve optimal gain yet minimum power consumption, the voltage across each transistor 62 and 64 be at a predefined amount. That voltage should be equal to or slightly greater than the gate-to-source voltage of each transistor minus the threshold of the respective transistors. In other words, $V_{DS} \geq V_{GS} - V_{TH}$. By placing the gain across each transistor at approximately the point at which a transistor goes from a linear region to a saturation region, the transistors are properly tuned at the threshold so that any modifications to the AC value supplied thereto will quickly transition the transistors from the saturation region to a non-saturation region (i.e., from a high gain to a low gain state). For example, if the $V_{GS}$ of transistor 64 equals 600 mV, and the threshold voltage $V_{TH}$ of transistor 64 equals 400 mV, then the desired $V_{DS}$ through transistor 64 drain and source regions should be equal to or greater than 200 mV. Once an amplitude increase occurs on terminal A, then the transistor can provide gain through this high gain state.

Figure 10:
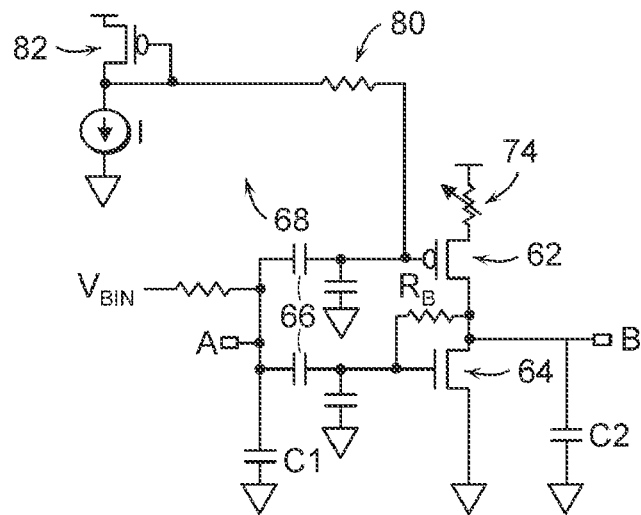
FIG. 10 is a circuit schematic of the oscillator in FIG. 8 inverted according to another embodiment.
Figure 11:
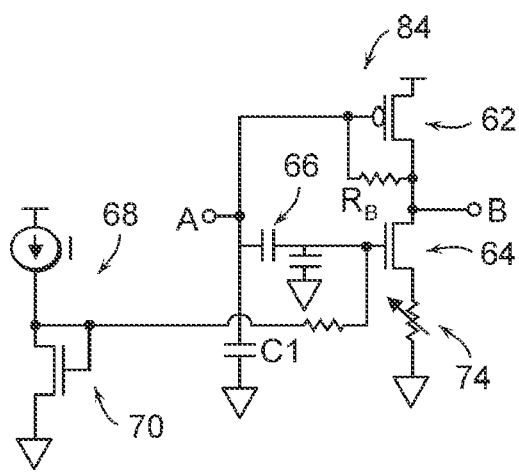
FIG. 11 is a circuit schematic of the oscillator in FIG. 8 absent a capacitor bias input.
Figure 12:
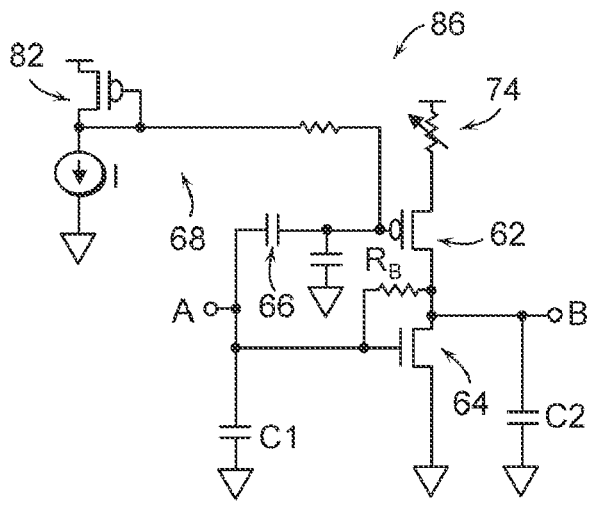
FIG. 12 is a circuit schematic of the oscillator in FIG. 10 absent a capacitor bias input.

FIGS. 10-12 illustrate alternative embodiments of circuit 60 of FIG. 8. For example, circuit 80 (FIG. 10) is substantially the same as circuit 60; however, instead of the current-controlled biasing circuit 68 having a n-channel transistor, circuit 68 has a p-channel transistor 82. Similarly, the amplitude control resistor 74 is coupled to the power supply rather than ground. Circuit 80 uses the biasing circuit 68 to bias p-channel transistor 82 rather than the n-channel transistor, with $R_B$ used to bias n-channel transistor 64. Circuit 84 (FIG. 11) is similar to circuit 60 except only a single loading capacitor C1 is used to adjust the frequency of the output. Moreover, only one set of coupling capacitors 66 are applied to the n-channel transistor 64, rather than to both transistors. Circuit 86 (FIG. 12) is similar to circuit 80 except circuit 86 does not require $V_{BIN}$ to set the operating voltages upon capacitor C1. Moreover, only one set of coupling capacitors are needed at the input of p-channel transistor 62, but not at the input of n-channel transistor 64.

The alternatives shown in FIGS. 10-12 can permeate to many other alternatives, all of which would include independent biasing of the p-channel and n-channel transistors which make up a CMOS inverter. Provided a current-controlled biasing circuit is supplied to bias at least one of the transistors, all of the various permutations and alternative embodiments are encompassed within the spirit and scope of the present invention. Moreover, a form of amplitude adjustment using, for example, a variable resistor, regardless of where that resistor is placed between the power supply and ground within the source-to-drain path, is also encompassed within the present invention.

While the invention has been particularly shown and described with reference to preferred embodiments thereof, it will be understood by those skilled in art that various changes in form and detail may be made without departing from the spirit and scope of the invention. The various circuit features set forth in the present disclosure are not to be interpreted as reflecting all possible features of the claimed invention. The specification and drawings are, therefore, to be regarded in an illustrative rather than a restrictive sense.

What is claimed is:

1. An oscillator amplifier circuit, comprising:
   an inverter that includes a first transistor and a second transistor, each said first transistor and said second transistors having a mutually-coupled drain terminal;
   a current-controlled biasing circuit coupled to a gate terminal of only the second transistor exclusive of direct or indirect coupling to a gate terminal of the first transistor for biasing the second transistor at approximately a threshold voltage of the second transistor; and
   a biasing resistor connected directly between the mutually-coupled drain terminal and a gate terminal of only the first transistor exclusive of direct or indirect coupling to a gate terminal of the second transistor for biasing the first transistor at approximately a threshold voltage of the first transistor.

2. The oscillator amplifier circuit as recited in claim 1, further comprising a variable resistor coupled to a source terminal of the second transistor for adjusting the amplitude of an output voltage produced on the mutually-coupled drain terminal.

3. The oscillator amplifier circuit as recited in claim 2, further comprising an amplitude detection circuit coupled to receive a resonator output and, depending on the resulting amplitude produced from the oscillator amplifier circuit, producing an amplitude regulation control signal forwarded to the variable resistor for adjusting the amplitude of the output voltage.

4. The oscillator amplifier circuit as recited in claim 1, wherein the first transistor comprises a p-channel transistor and the second transistor comprises an n-channel transistor.

5. The oscillator amplifier circuit as recited in claim 1, wherein the current-controlled biasing circuit is adapted to produce a staff-up current upon activation of the oscillator amplifier circuit that can be programmable to produce a reliable oscillator amplifier circuit operation across varying conditions.

6. The oscillator amplifier circuit as recited in claim 1, further comprising a resistor coupled between the current-controlled biasing circuit and the gate terminal of the second transistor for substantially preventing the current-controlled biasing circuit from loading an oscillator/resonator circuit.

7. The oscillator amplifier circuit as recited in claim 1, wherein the current-controlled biasing circuit comprises:
   a current source; and
   a third transistor having a source terminal coupled to a supply voltage, and a mutually-coupled gate and drain terminal of the third transistor coupled to the gate terminal of the second transistor.

8. An oscillator, comprising:
   a first transistor and a second transistor coupled between a power supply and a ground supply, each first and second transistor having a drain terminal coupled to one another;
   a direct current voltage at approximately a threshold voltage value applied through a resistor to a gate terminal of the second transistor;
   a resonator coupled between the drain terminal and a gate terminal of the first and second transistors; and
   a biasing resistor connected directly between the mutually-coupled drain terminal and a gate terminal of only the first transistor exclusive of direct or indirect coupling to a gate terminal of the second transistor for biasing the first transistor at approximately a threshold voltage of the first transistor.

9. The oscillator as recited in claim 8, further comprising a variable resistor coupled to a source terminal of the second transistor for adjusting the amplitude of an output voltage produced on the mutually-coupled drain terminal.

10. The oscillator as recited in claim 9, further comprising an amplitude detection circuit coupled to receive a resonator output and, depending on the resulting amplitude produced from the oscillator, producing an amplitude regulation control signal forwarded to the variable resistor for adjusting the amplitude of the output voltage.

11. The oscillator as recited in claim 8, wherein the first transistor comprises a p-channel transistor and the second transistor comprises an n-channel transistor.

12. The oscillator as recited in claim 8, wherein the first transistor comprises an n-channel transistor and the second transistor comprises a p-channel transistor.

13. The oscillator as recited in claim 8, wherein the resistor is coupled for substantially preventing a biasing current from over loading the oscillator.

14. The oscillator as recited in claim 8, wherein the direct current voltage is supplied from a current-controlled biasing circuit that comprises:
   a current source; and
   a third transistor having a source terminal coupled to a supply voltage, and a mutually-coupled gate and drain terminal of the third transistor coupled to the gate terminal of the second transistor via the resistor.

15. A method for regulating a resonating output, comprising:
   regulating current through a biasing circuit to form a pre-determined DC voltage;
   applying the DC voltage to an input of only one of a pair of transistors coupled to form an inverter, exclusive of applying the DC voltage directly or indirectly to an input of the other of the pair of transistors;
   biasing an input of the other of the pair of transistors by applying a resistive load between a gate terminal and a drain terminal of that transistor; and resonating an AC voltage across an input and an output of the inverter.

16. The method as recited in claim 15, further comprising regulating an amplitude of a voltage produced across the input and output of the inverter by applying a variable resistive load to a source terminal of the one of the pair of transistors.

17. The method as recited in claim 15, further comprising detecting an amplitude produced from the resonating output corresponding to an amplitude of the resonating AC voltage and using the produced amplitude to control the amount of resistance of the variable resistive load.

18. The method as recited in claim 15, wherein said regulating comprises sourcing current through a diode-coupled transistor to produce the pre-determined DC voltage from a terminal of the diode-coupled transistor.

* * * * *

UNITED STATES PATENT AND TRADEMARK OFFICE
CERTIFICATE OF CORRECTION

| | | |
|---|---|---|
| PATENT NO. | : 7,355,489 B2 | Page 1 of 1 |
| APPLICATION NO. | : 11/351987 | |
| DATED | : April 8, 2008 | |
| INVENTOR(S) | : Maheshwari | |

It is certified that error appears in the above-identified patent and that said Letters Patent is hereby corrected as shown below:

Col. 9, line 64: In claim 5, delete "staff-up" and substitute therefor --start-up--.

Signed and Sealed this

First Day of July, 2008

JON W. DUDAS
*Director of the United States Patent and Trademark Office*